(12) United States Patent
Sun et al.

(10) Patent No.: US 12,176,181 B2
(45) Date of Patent: Dec. 24, 2024

(54) PATTERN INSPECTING DEVICE

(71) Applicant: Hitachi High-Tech Corporation, Tokyo (JP)

(72) Inventors: Wei Sun, Tokyo (JP); Yasunori Goto, Tokyo (JP); Takuma Yamamoto, Tokyo (JP); Makoto Sakakibara, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 355 days.

(21) Appl. No.: 17/788,887

(22) PCT Filed: Jan. 10, 2020

(86) PCT No.: PCT/JP2020/000722
§ 371 (c)(1),
(2) Date: Jun. 24, 2022

(87) PCT Pub. No.: WO2021/140662
PCT Pub. Date: Jul. 15, 2021

(65) Prior Publication Data
US 2022/0359151 A1    Nov. 10, 2022

(51) Int. Cl.
*H01J 37/22* (2006.01)
*G06N 3/08* (2023.01)
(Continued)

(52) U.S. Cl.
CPC ............. *H01J 37/222* (2013.01); *G06N 3/08* (2013.01); *H01J 37/1478* (2013.01);
(Continued)

(58) Field of Classification Search
CPC .... H01J 37/222; H01J 37/1478; H01J 37/244; H01J 37/28; H01J 2237/24475; H01J 2237/2817
See application file for complete search history.

(56) References Cited

U.S. PATENT DOCUMENTS 7,732,761 B2 * 6/2010 Tanaka ............... G01N 23/2251
703/2
2006/0210143 A1    9/2006 Miyamoto et al.
(Continued)

FOREIGN PATENT DOCUMENTS

JP    2006258516 A    9/2006
JP    2007218711 A    8/2007
(Continued)

OTHER PUBLICATIONS

Search Report mailed Feb. 25, 2020 in International Application No. PCT/JP2020/000722.
(Continued)

*Primary Examiner* — David E Smith
(74) *Attorney, Agent, or Firm* — Miles & Stockbridge, P.C.

(57) ABSTRACT

From a reference waveform 112 and a BSE signal waveform 211 that is extracted from a backscattered electron image and indicates a backscattered electron signal intensity from a pattern along a first direction, a difference waveform indicating a relationship between the backscattered electron signal intensity and a difference between a coordinate of the BSE signal waveform and a coordinate of the reference waveform which have the same backscattered electron signal intensity is generated, and presence or absence of a shielded region 203 that is not irradiated with a primary electron beam on a side wall of the pattern is determined based on the difference waveform. The reference waveform indicates a backscattered electron signal intensity from a reference pattern along the first direction in which the side wall is formed perpendicularly to an upper surface and a bottom surface of the pattern when the reference pattern is scanned with the primary electron beam.

16 Claims, 13 Drawing Sheets

(51) Int. Cl.
*H01J 37/147* (2006.01)
*H01J 37/244* (2006.01)
*H01J 37/28* (2006.01)

(52) U.S. Cl.
CPC ............ *H01J 37/244* (2013.01); *H01J 37/28* (2013.01); *H01J 2237/24475* (2013.01); *H01J 2237/2817* (2013.01)

(56) References Cited

U.S. PATENT DOCUMENTS

| | | |
|---|---|---|
| 2007/0187595 A1 | 8/2007 | Tanaka et al. |
| 2014/0268117 A1 | 9/2014 | Kolchin et al. |
| 2019/0148108 A1* | 5/2019 | Sun .................... H01J 37/244 250/307 |

FOREIGN PATENT DOCUMENTS

| | | |
|---|---|---|
| JP | 2019087518 A | 6/2019 |
| TW | I603075 B | 10/2017 |

OTHER PUBLICATIONS

Written Opinion mailed Feb. 25, 2020 in International Application No. PCT/JP2020/000722.
Office Action mailed Dec. 2, 2021 in Taiwanese Application No. 109143801.

\* cited by examiner

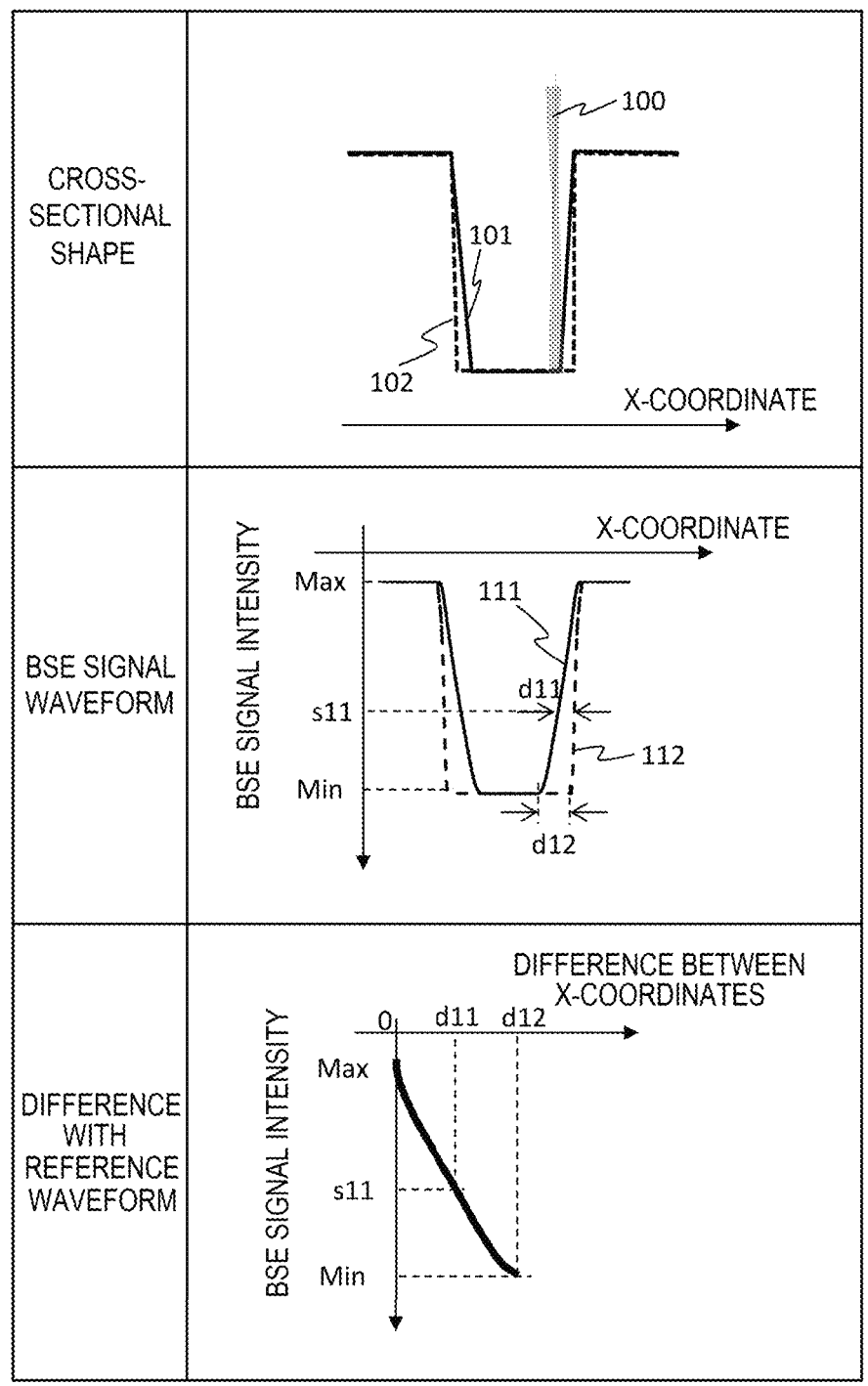
[FIG. 1]

[FIG. 2]
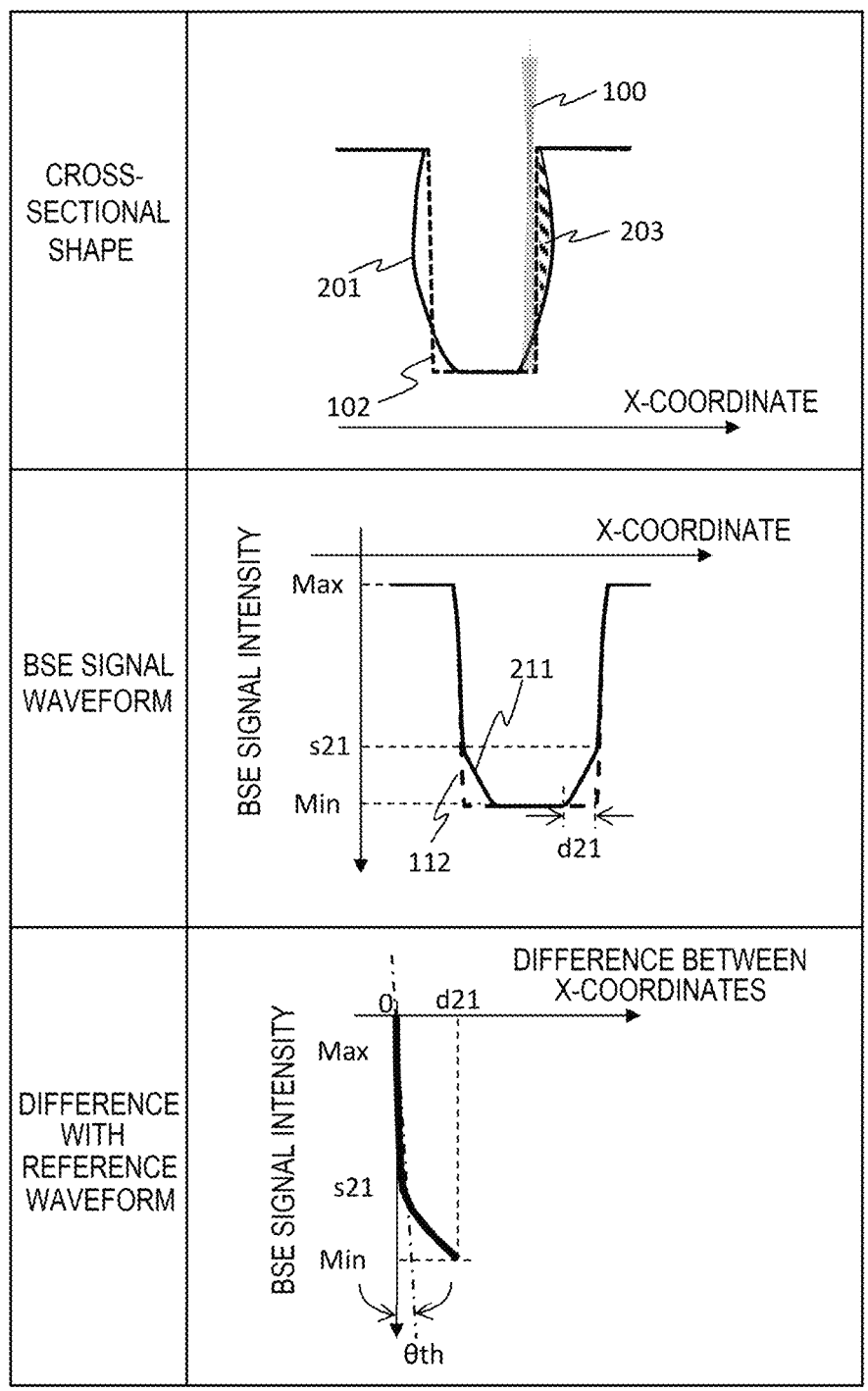

[FIG. 3]
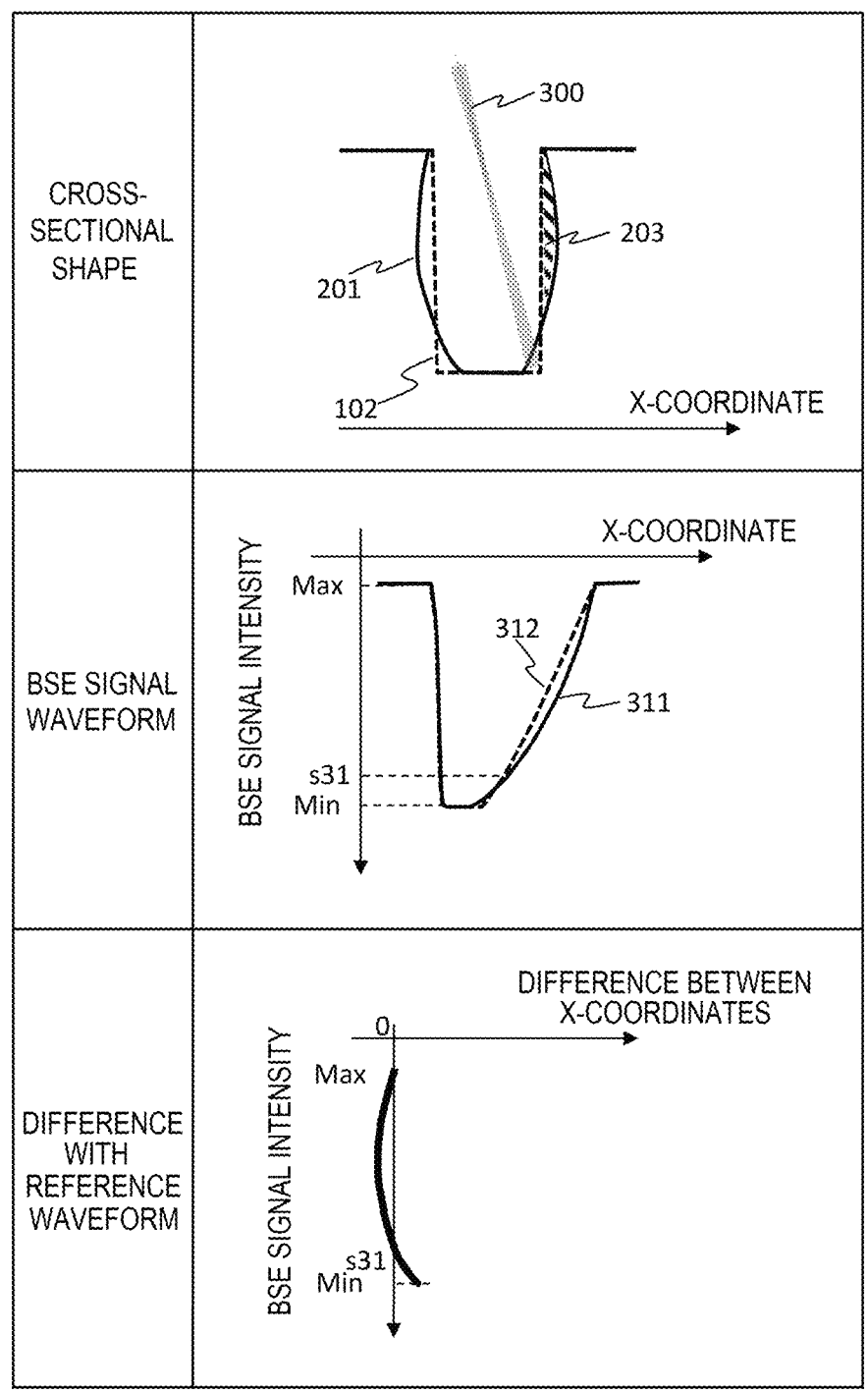

[FIG. 4]
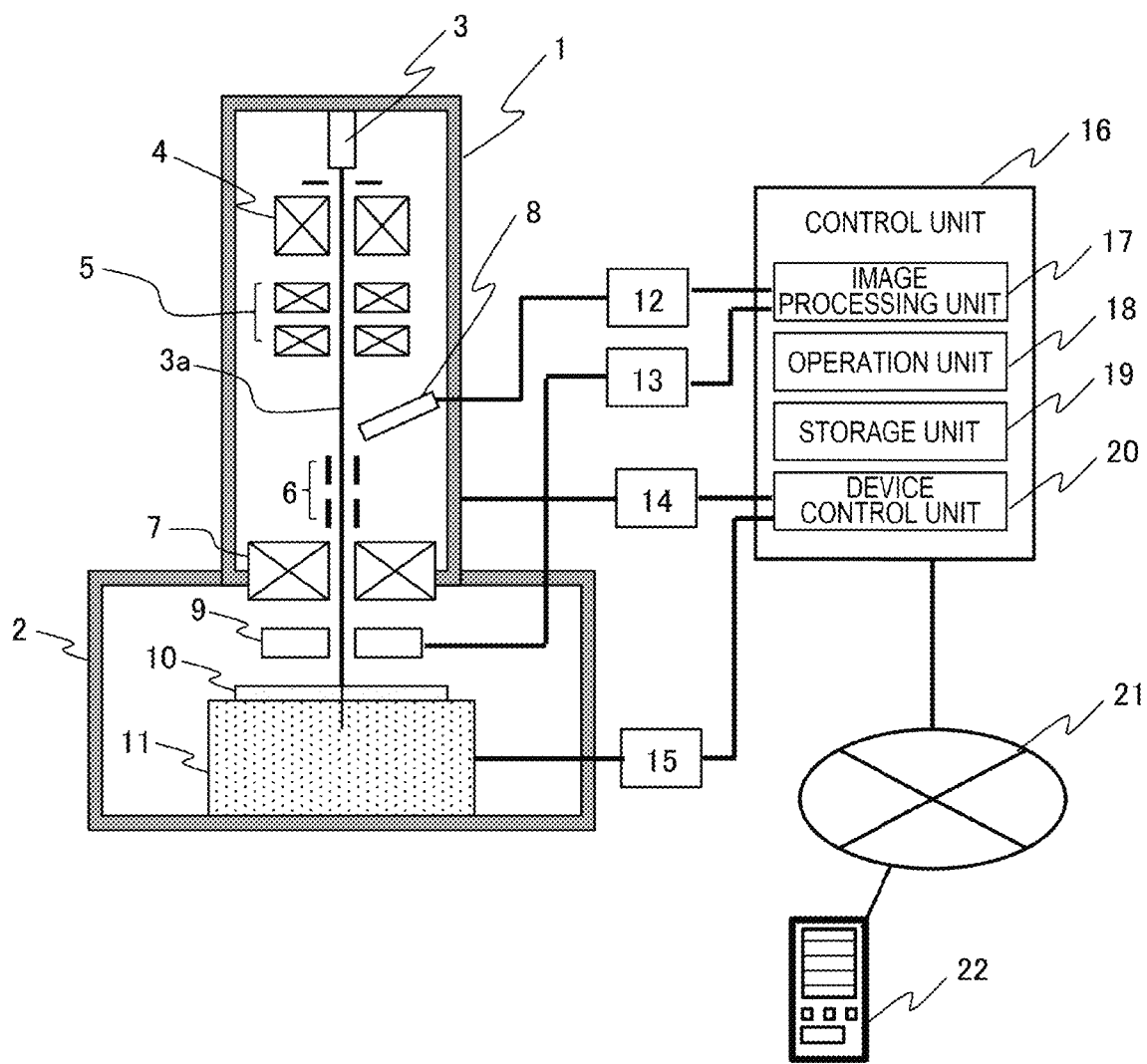

[FIG. 5]
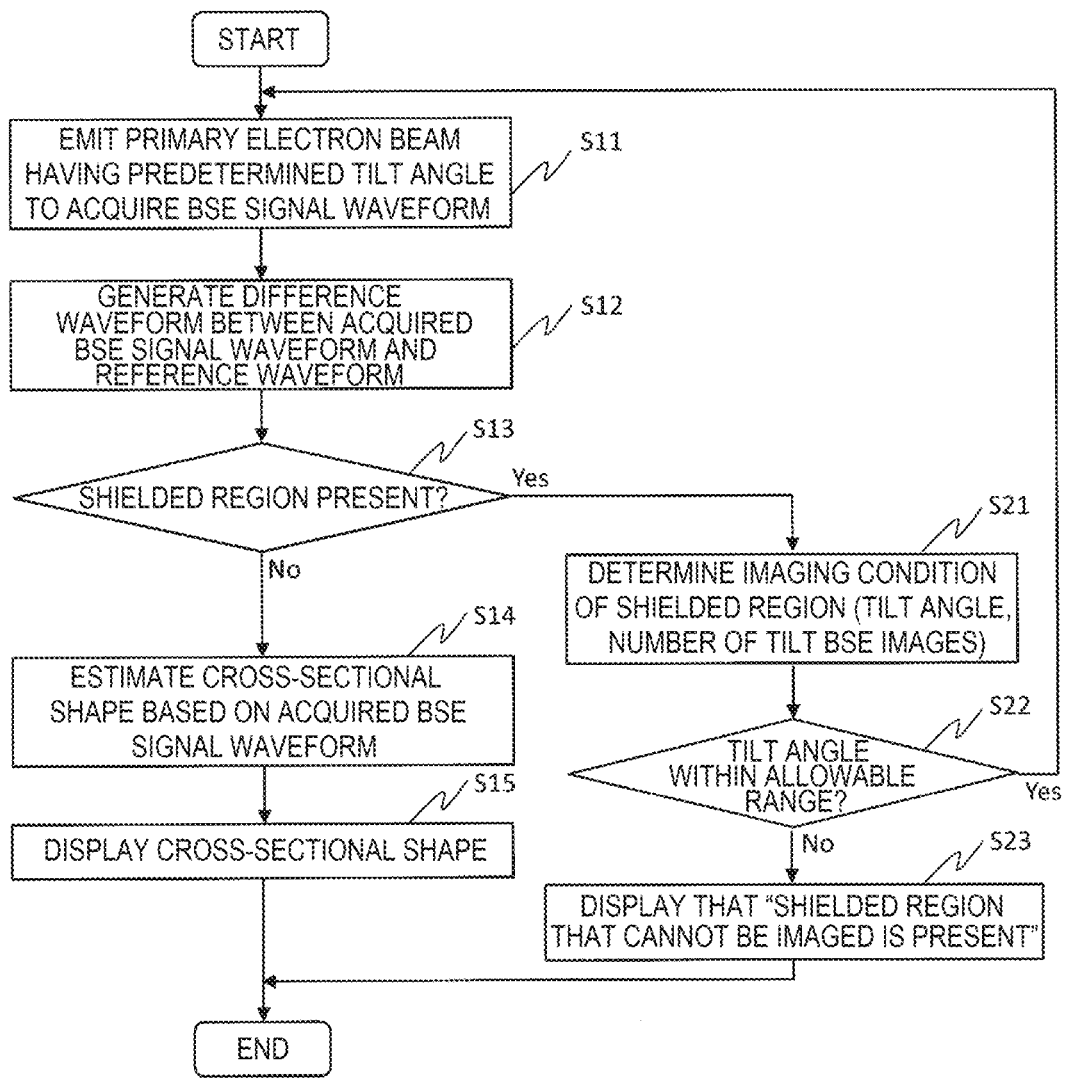

[FIG. 6]
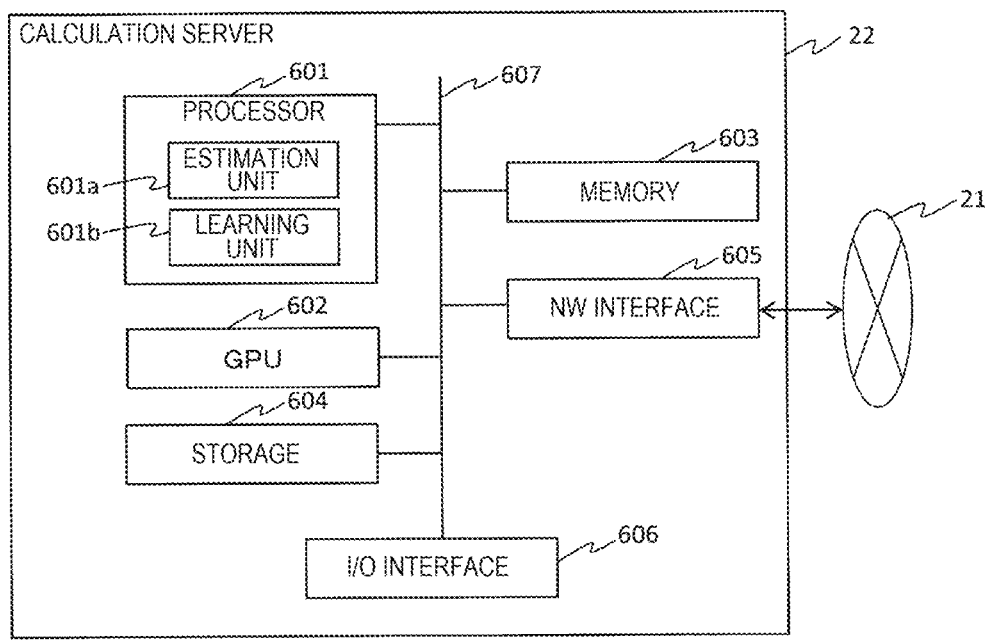

[FIG. 7]

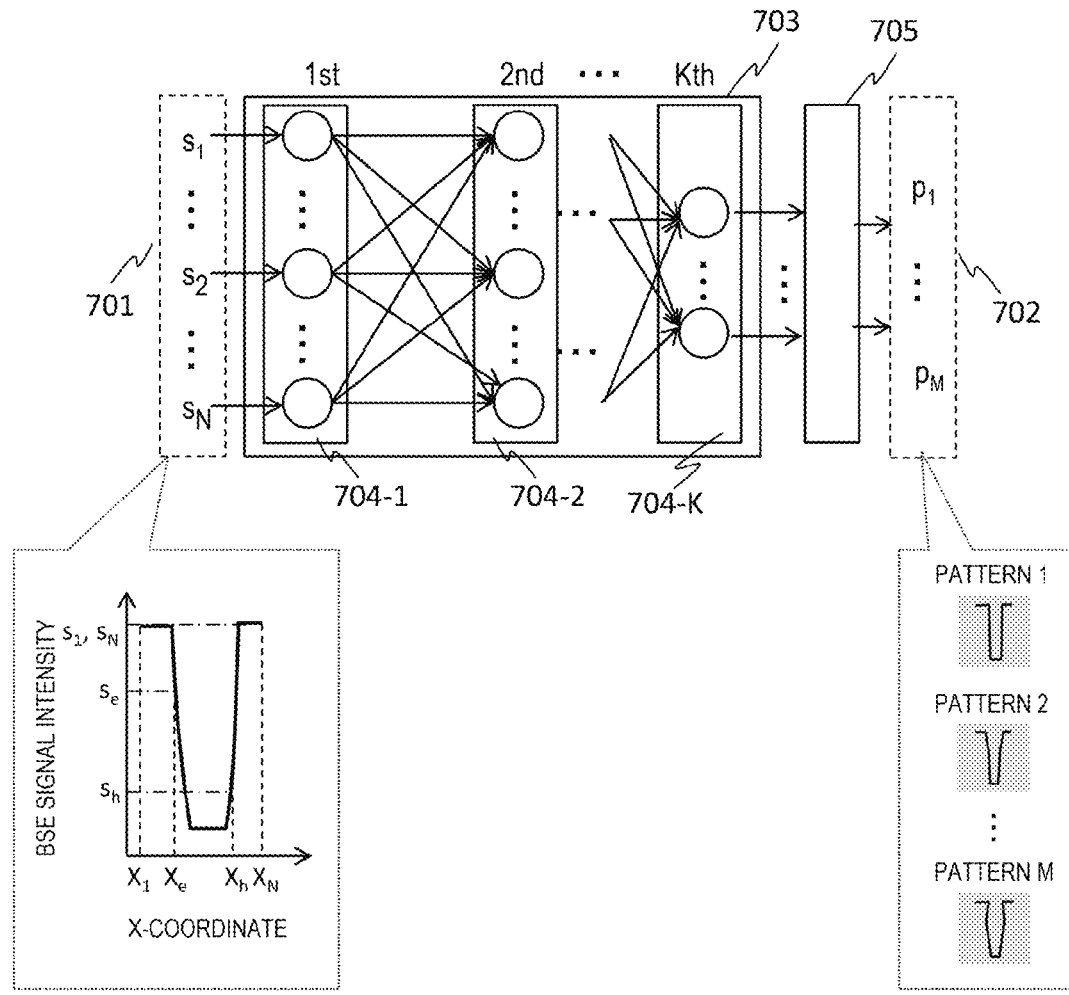

[FIG. 8]

| OPTICAL CONDITIONS | | | CONDITION OF SAMPLES | CNN MODEL (1~J) |
|---|---|---|---|---|
| ACCELERATION VOLTAGE ($\alpha1\sim\alpha a$) | DIVERGENCE ANGLE ($\beta1\sim\beta b$) | TILT ANGLE ($\gamma1\sim\gamma c$) | MATERIAL ($\delta1\sim\delta d$) | |
| $\alpha1$ | $\beta1$ | $\gamma1$ | $\delta1$ | MODEL 1 |
| $\alpha2$ | $\beta1$ | $\gamma1$ | $\delta1$ | MODEL 2 |
| ... | ... | ... | ... | ... |
| $\alpha a$ | $\beta b$ | $\gamma c$ | $\delta(d-1)$ | MODEL (J-1) |
| $\alpha a$ | $\beta b$ | $\gamma c$ | $\delta d$ | MODEL J |

[FIG. 9A]
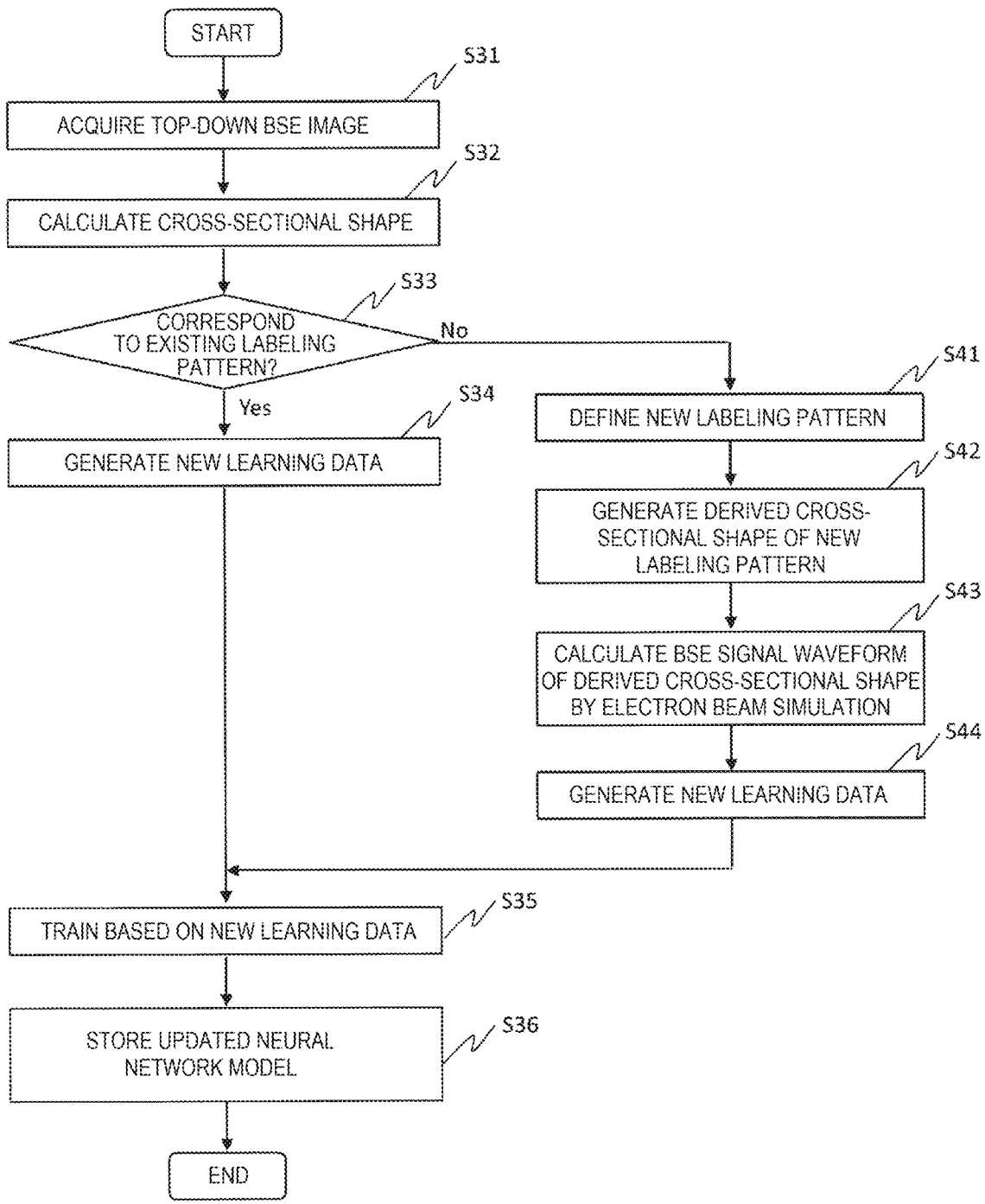

[FIG. 9B]
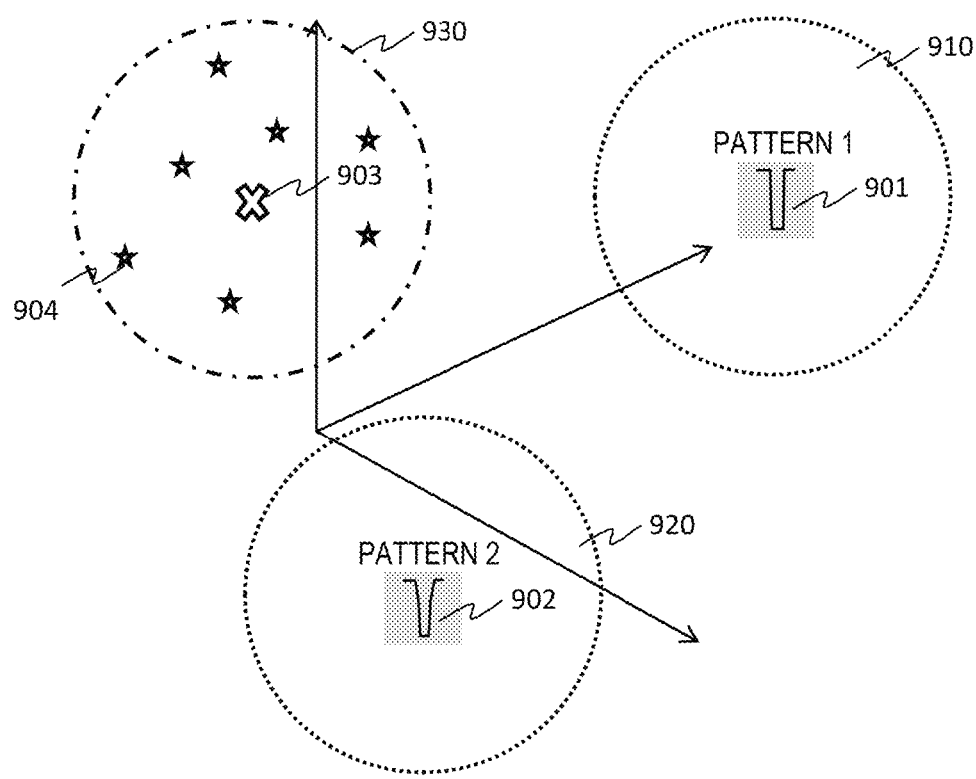

[FIG. 10A]
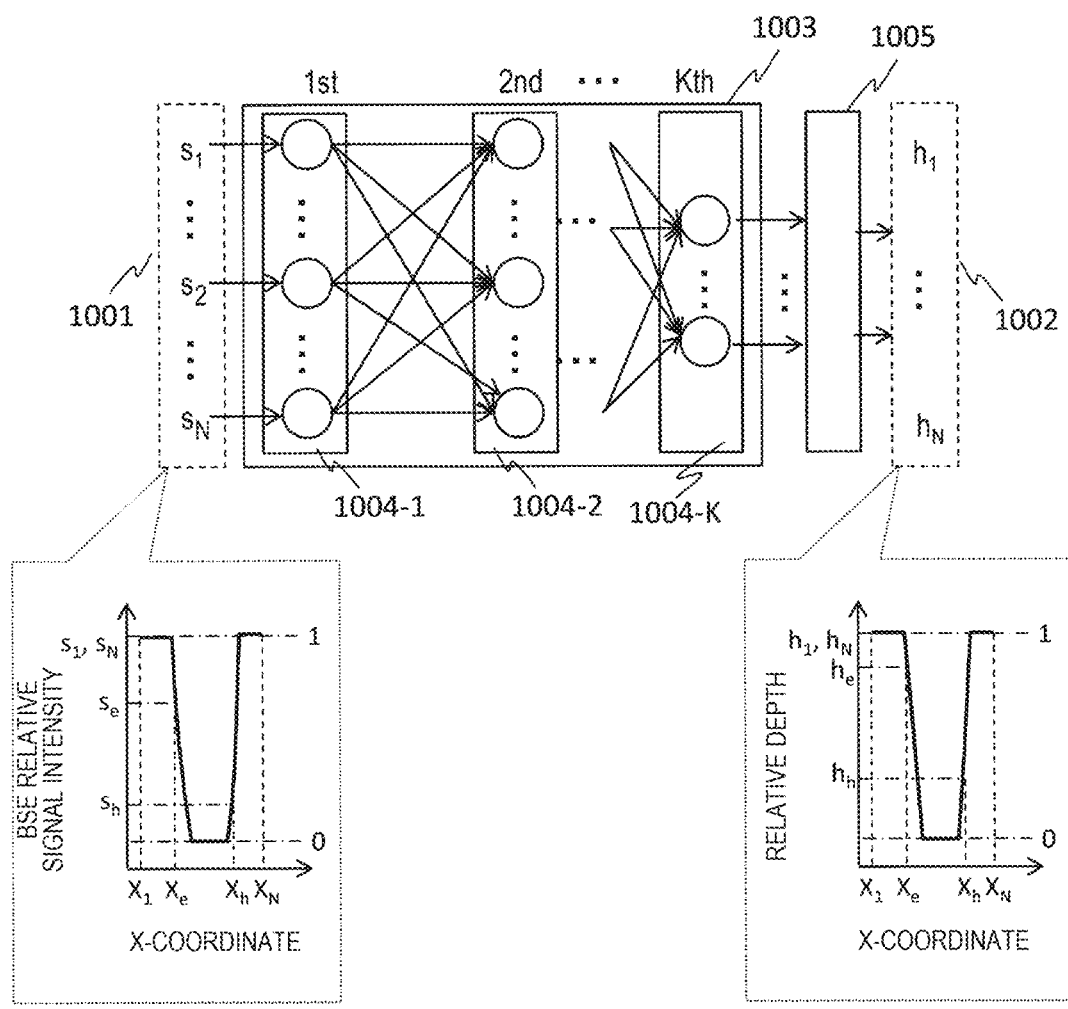

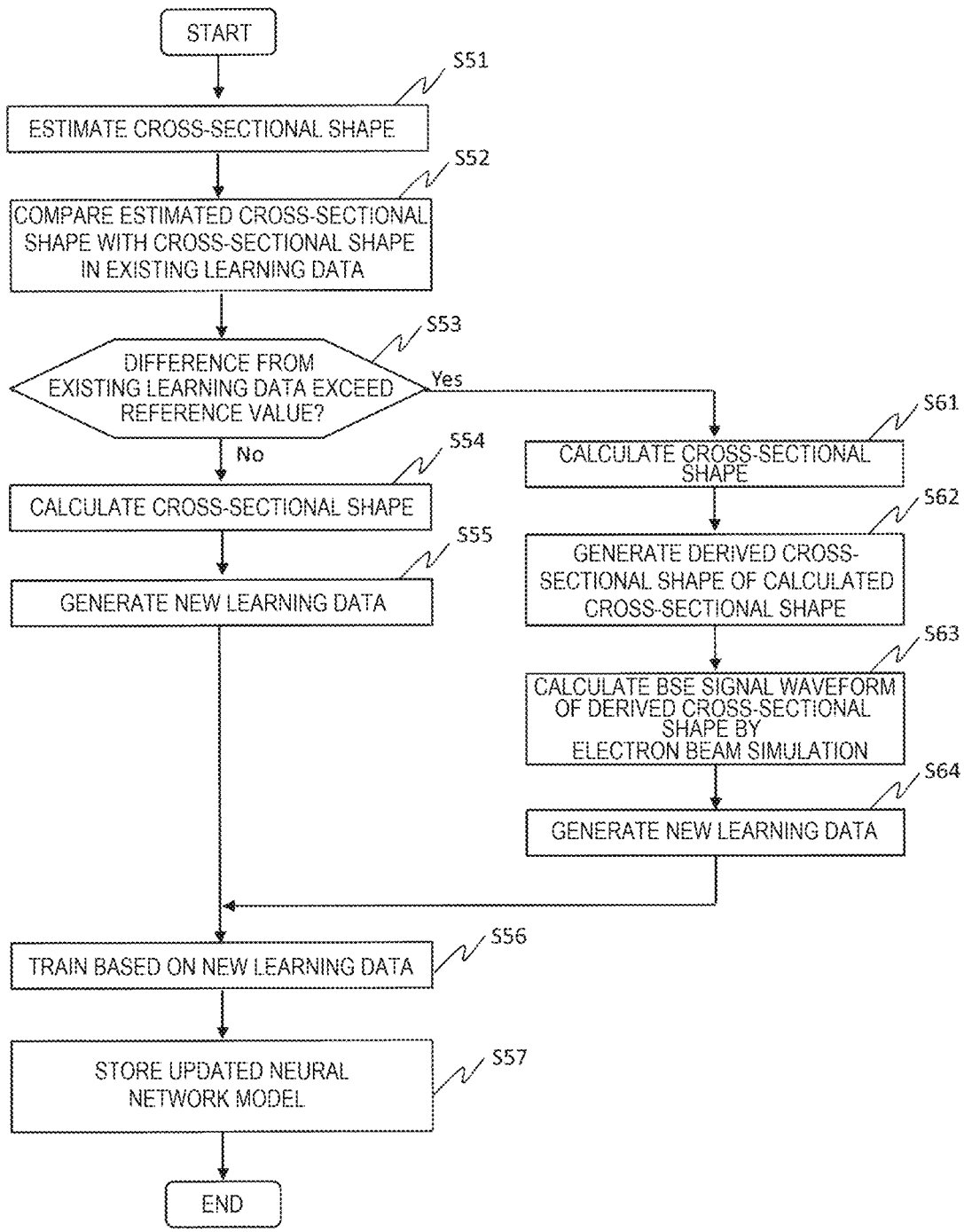
[FIG. 10B]

[FIG. 11]
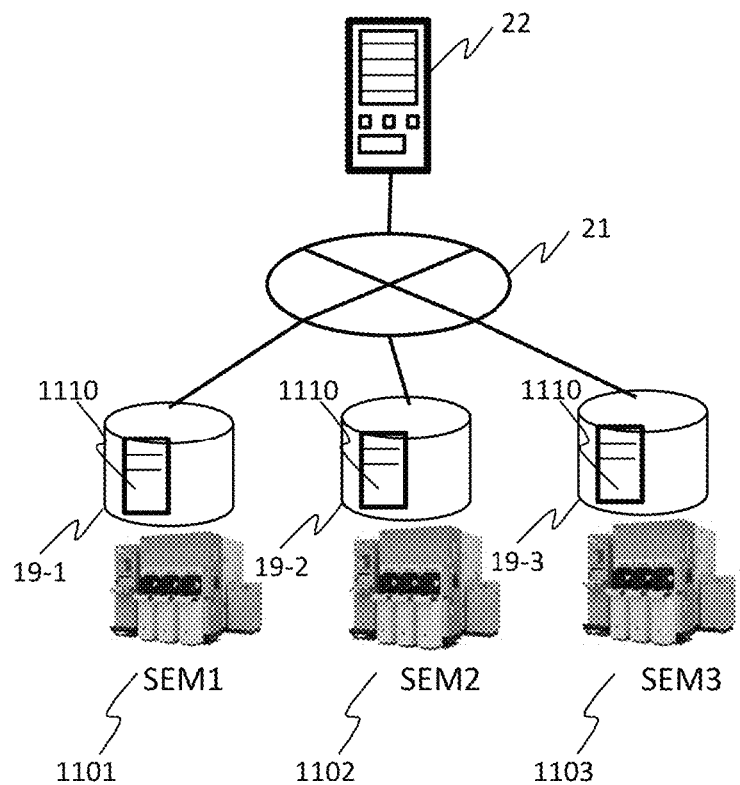
[FIG. 12]
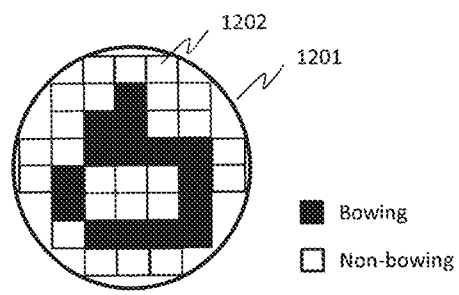

[FIG. 13]
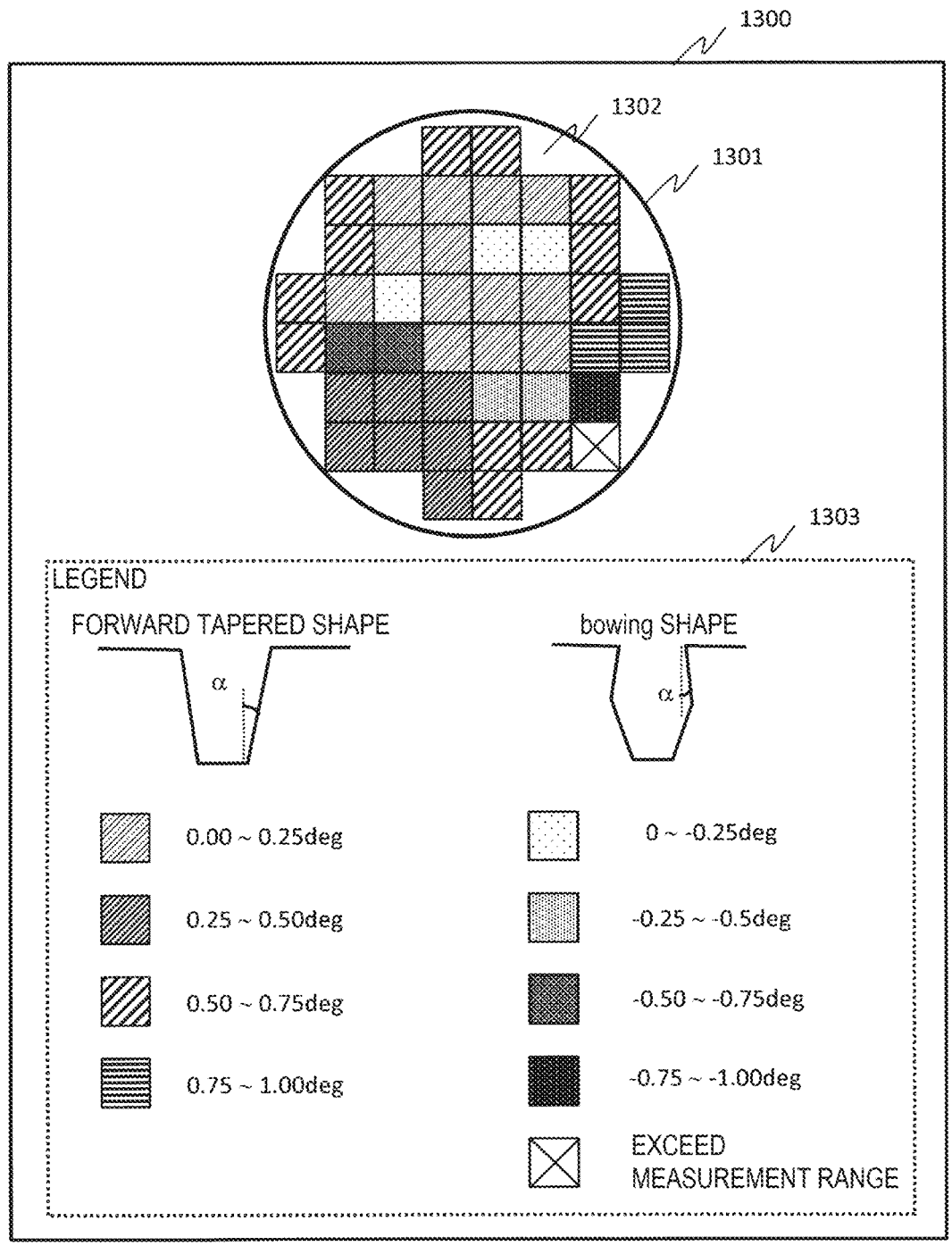

PATTERN INSPECTING DEVICE

TECHNICAL FIELD

The present invention relates to a pattern inspecting device for inspecting a cross-sectional shape of a pattern formed on a semiconductor wafer or the like.

BACKGROUND ART

A semiconductor device has been miniaturized and highly integrated in order to increase the capacity of a memory and reduce a bit cost. In recent years, a demand for higher integration has bees increasing, and development and manufacturing of a three-dimensional structure device having a structure as an alternative for miniaturization have been advanced.

When making a planar structure three-dimensional, the device as a whole tends to be thicker. Accordingly, for example, in a structure such as 3D-NAND or DRAM, the number of layers of a stacked film increases, and in a process of forming a hole, a groove, and the like, a ratio (aspect ratio) of a planar size to a depth of the hole or the groove tends to increase. An accurate cross-sectional shape of a hole or a groove having a high aspect ratio can be obtained cutting and measuring a wafer, but when checking uniformity a wafer surface in a semiconductor manufacturing process, it is necessary to obtain cross-sectional shapes of a large number of holes and grooves, which is troublesome and costly. PTL 1 discloses that, based on a backscattered electron (reflected electron) image obtained by top-down observation of a pattern, backscattered electron signal intensities from an upper surface, a bottom surface, and side walls of a pattern are compared, and a cross-sectional shape of the side wall of the pattern is measured based on a difference in height between the upper surface and the bottom surface.

PTL 2 discloses that an electron microscope image is created by electron beam simulation, and simulation images having various shapes are recorded as a library. In electron beam simulation, a process of generating the electron microscope image by a scanning electron microscope is simulated, and a relationship between a shape of a measurement target and a waveform of the electron microscope image is calculated.

CITATION LIST

Patent Literature

PTL 1: JP-A-2019-87518
PTL 2: JP-A-2007-218711

SUMMARY OF INVENTION

Technical Problem

In a pattern having a high aspect ratio, it is difficult to control formation of a shape of a side wall or a bottom portion, and the pattern may have a shape such as a tapered shape, a bowing shape, and a twisting shape. For example, as in PTL 1, when a cross-sectional shape or a three-dimensional shape of the pattern is measured by top-down observation by a charged particle beam device, a shielded region that is not irradiated with a charged particle beam may be generated in a part or the whole of the side wall according to the cross-sectional shape. In this case, the cross-sectional shape of the shielded region cannot be accurately estimated. However, the shielded region can be eliminated by irradiation with a tilted charged particle beam.

Therefore, in the invention, when a cross-sectional shape of a pattern is inspected by top-down observation, presence or absence of a shielded region is determined based on a backscattered electron signal intensity. Only when it is determined that the shielded region is present, throughput of a cross-sectional shape inspection of the pattern by the top-down observation can be improved by acquiring an additional image by changing tilting of a beam.

Further, in order to perform the cross-sectional shape inspection of the pattern at a high speed, the cross-sectional shape is estimated by using a learned neural network model.

Solution to Problem

A pattern inspecting device according to an aspect of the invention is a pattern inspecting device for inspecting a cross-sectional shape of a pattern formed on a sample. The pattern inspecting device includes: an electron optical system configured to irradiate the sample with a primary electron beam under control of a device control unit; an electron detector configured to detect backscattered electrons emitted by scanning the pattern with the primary electron beam; an image processing unit configured to form an image based on a detection signal of the electron detector; and an operation unit configured to generate, based on a reference waveform and a BSE signal waveform that is extracted from a BSE image formed by the image processing unit based on the detection signal of the electron detector and indicates a backscattered electron signal intensity from the pattern along a first direction, a difference waveform indicating a relationship between the backscattered electron signal intensity and a difference between a coordinate of the BSE signal waveform and a coordinate of the reference waveform which have the same backscattered electron signal intensity, and determine presence or absence of a shielded region that is not irradiated with the primary electron beam on a side wall of the pattern based on the difference waveform. Here, the reference waveform indicates a backscattered electron signal intensity from a reference pattern in which a side wall is formed perpendicularly to an upper surface and a bottom surface of the pattern along the first direction when the reference pattern is scanned with the primary electron beam.

Advantageous Effects of Invention

An inspection of a cross-sectional shape of a deep hole or a deep groove can be performed with a high accuracy and a high throughput.

BRIEF DESCRIPTION OF DRAWINGS

FIG. 1 is a diagram for illustrating a method for determining a shielded region.

FIG. 2 is a diagram for illustrating a determination method of the shielded region.

FIG. 3 is a diagram for illustrating a determination method of the shielded region.

FIG. 4 is a diagram illustrating a pattern inspecting device.

FIG. 5 is a flowchart of inspecting a cross-sectional shape of a pattern.

FIG. 6 illustrates a hardware configuration example of a calculation server.

FIG. 7 illustrates an example of a neural network model.

FIG. 8 is a diagram illustrating a relationship between parameters and neural network models.

FIG. 9A is a flowchart of updating the neural network model.

FIG. 9B is a diagram illustrating a labeling pattern in a feature data space.

FIG. 10A illustrates another example of the neural network model.

FIG. 10B is a flowchart of updating the neural network model.

FIG. 11 is a diagram illustrating a calculation server to which a plurality of SEMs are connected.

FIG. 12 illustrates an example of a display screen of an inspection result.

FIG. 13 illustrates an example of a display screen of an inspection result.

DESCRIPTION OF EMBODIMENTS

Hereinafter, a pattern inspecting device suitable for inspecting a cross-sectional shape of a hole pattern or a groove pattern having a particularly high aspect ratio in a semiconductor manufacturing process, and a method for estimating a cross-sectional shape of a pattern using the pattern inspecting device will be described. Although a semiconductor wafer on which a pattern is formed is exemplified as a sample to be inspected, the invention is not limited to a semiconductor pattern, and any sample that can be observed by a charged particle beam device may be used.

First, a method for determining a shielded region using the pattern inspecting device according to the present embodiment will be described with reference to FIGS. 1 to 3. In each diagram, a cross-sectional shape along an X direction of a pattern to be inspected is illustrated at an upper part, a backscattered electron (BSE) signal waveform along the X direction of the pattern to be inspected is illustrated at a middle part, and a difference between the BSE signal waveform at the middle part and a reference waveform is illustrated at a lower part.

FIG. 1 illustrates a case where an upper surface of the sample is perpendicularly irradiated with a charged particle beam with respect to a pattern without a shielded region. In an upper part, a cross-sectional shape 101 or the pattern to be inspected is indicated by a solid line, and a reference cross-sectional shape 102 that is a cross-sectional shape of a reference pattern is indicated by a broken line. In the reference pattern, side walls are formed perpendicularly to an upper surface and a bottom surface of the pattern. Since a vertical irradiation beam 100 has a predetermined divergence angle, a spot diameter on a bottom surface of the sample is larger than a spot diameter on the upper surface of the sample. In the pattern to be inspected in FIG. 1, since the bottom surface is included in the upper surface in a top view and a diameter gradually increases from a bottom surface position to an upper surface position, the vertical, irradiation beam 100 is emitted to an entire region of the side walls, and the shielded region is not present. Such a cross-sectional shape is referred to as a forward tapered shape.

In a middle part, a BSE signal waveform 111 along the X direction of the pattern having the cross-sectional shape 101 is indicated by a solid line, and a BSE signal waveform (reference waveform 112) along the X direction of the reference pattern having the reference cross-sectional shape 102 is indicated by a broken line. The BSE signal waveform of the reference pattern is referred to as a reference waveform. A vertical axis represents a BSE signal intensity and a horizontal axis represents an X-coordinate. Here, a BSE signal amount generated by irradiating a hole pattern or a groove pattern with the charged particle beam is indicated as $\eta \cdot e^{-H}$ (here, H represents a depth from the upper surface of the sample, and $\eta$ represents a coefficient) when the divergence angle of the vertical irradiation beam 100 is 0. When the divergence angle is not 0, the BSE signal intensity is a function of a depth from the upper surface of the sample at a position irradiated with the vertical irradiation beam 100 although the BSE signal intensity is affected by spread of spots according to the divergence angle.

A lower part illustrates a difference between the BSE signal waveform 111 on a right side-wall of the pattern and the reference waveform 112. A vertical axis represents the BSE signal intensity, and a horizontal axis represents a difference between an X-coordinate of the BSE signal waveform 111 and an X-coordinate of the reference waveform 112 which have the same BSE signal intensity. In the case of the forward tapered shape, a waveform is shown in which as the BSE signal intensity decreases, a difference between X-coordinates monotonically increases with a difference on the upper surfaces of the sample (BSE signal intensity=Max) being 0 and a difference on the bottom surfaces (BSE signal intensity=Min) being a maximum value (d12).

FIG. 2 illustrates a case where an upper surface of a sample is perpendicularly irradiated with a charged particle beam with respect to a pattern having a shielded region. As a cross-sectional shape 201 (solid line) of a pattern to be inspected illustrated in an upper part, a bowing shape of which the middle is bulged illustrated. Therefore, a shielded region 203 that is not irradiated with the vertical irradiation beam 100 is present.

In a middle part, a BSE signal waveform 211 along the X direction of the pattern having the cross-sectional shape 201 is indicated by a solid line. Accordingly, the BSE signal intensity does not include information on a depth of a side wall in the shielded region 203 since a part of the side wall is not irradiated with the vertical irradiation beam 100, and the BSE signal intensity changes according to a depth from the upper surface of the sample of a position irradiated with the vertical irradiation beam 100 only in a part of the side wall irradiated with the vertical irradiation beam 100.

Therefore, a difference between the BSE signal waveform 211 on a right side-wall of the pattern and the reference waveform 112 illustrated in a lower part is 0 in a region corresponding to the shielded region 203. On the other hand, since the side wall other than the shielded region 203 in the cross-sectional shape 201 has the forward tapered shape, a difference between X-coordinates monotonically increases as the BSE signal intensity decreases in a region corresponding to the side wall other than the shielded region 203.

Accordingly, there is a feature that, when a shielded region that is not irradiated with the charged particle beam is present, a region where the difference between the X-coordinates is 0 regardless of the BSE signal intensity is present in the difference waveform. Therefore, for example, presence or absence of the shielded region in a pattern to be inspected can be determined by determining presence or absence of a region where a slope of a difference waveform of X coordinates with respect to BSE signal intensity is equal to or smaller than a predetermined slope $\theta th$. As a determination method based on the slope, a differential value of the difference waveform is calculated, and the presence or absence of the shielded region may also be determined based on a magnitude of the differential value. In addition, the present determination method is not limited to the exemplified bowing shape, and can be applied to a general cross-sectional shape including a shielded region on a side wall, such as a twisting shape.

FIG. 3 illustrates a case where a pattern having the same shielded region as that in FIG. 2 is irradiated with a charged particle beam tilted in the X direction. In this example, by emitting a tilted beam 300, the shielded region 203 that cannot be irradiated with the vertical irradiation beam 100 can be irradiated with the charged particle beam, and the shielding region disappears from the right side-wall.

In a middle part, a BSE signal waveform 311 along the X direction of the pattern having the cross-sectional shape 201 is indicated by a solid line, and a ESE signal waveform (reference waveform 312) along the X direction of the reference pattern having the reference cross-sectional shape 102 is indicated by a broken line. Since the shielded region is not present on the right side-wall, the depth information of the side wall is included in a region of the BSE signal waveform 311 corresponding to the right side-wall side. Therefore, a cross-sectional shape of the right side-wall of the pattern can be estimated from the BSE signal waveform 311. Since the charged particle beam is tilted, the reference waveform 312 is different from the reference waveform 212 in the case of the vertical irradiation beam 100.

A lower part illustrates a difference between the BSE signal waveform 311 on the right side-wall of the pattern and the reference waveform 312. In this example, a waveform is shown in which a difference between X-coordinates first monotonously decreases as the BSE signal intensity decreases with a difference on the upper surfaces of the sample being 0, and when an inflection point is exceeded, the difference monotonously increases as the ESE signal intensity decreases. In a case where the shielded region 203 is also present by the irradiation with the tilted beam 300, a region where the difference between the X coordinates becomes 0 appears in the difference waveform regardless of the ESE signal intensity. Also, in this case, the presence or absence of the shielded region can be determined based on a slope of the difference waveform.

FIG. 4 illustrates the pattern inspecting device according to the present embodiment. As the pattern inspecting device, an example in which a scanning electron microscope (SEM) is used will be described. The scanning electron microscope main body includes an electron optical column 1 and a sample chamber 2. The column 1 includes, as main components of an electron optical system, an electron gun 3 that generates electrons and is an source of a primary electron beam that is energized at a predetermined acceleration voltage, a condenser lens 4 that focuses an electron beam, a deflector 6 that scans a wafer (sample) 10 with the primary electron beam, and an objective lens 7 that focuses the primary electron beam and irradiates a sample with the primary electron beam. In addition, a deflector 5 that makes the primary electron beam a tilted beam by separating the primary electron beam from an ideal optical axis 3a and deflecting the separated beam in a direction tilted with respect to the ideal optical axis 3a is provided. The optical elements constituting the electron optical system are controlled by an electron optical system control unit 14. The wafer 10, which is a sample, is placed on an XY stage 11 disposed in the sample chamber 2, and the wafer 10 is moved according to a control signal given from a stage control unit 15. A device control unit 20 of a control unit 16 controls the electron optical system control unit 14 and the stage control unit 15, so that an observation region of the wafer 10 is scanned with the primary electron beam.

In the present embodiment, in order to inspect a cross-sectional shape of a deep hole or a deep groove having a high aspect ratio, the wafer 10 is irradiated with a high-energy (high acceleration voltage) primary electron beam that can reach a deep, portion of the pattern. Electrons generated by scanning the wafer 10 with the primary electron beam are detected by a first electron detector 8 and a second electron detector 9. Detection signals output from the detectors are respectively signal-converted by an amplifier 12 and an amplifier 13, and input to an image processing unit 17 of the control unit 16.

The first electron detector 8 mainly detects secondary electrons generated by irradiating a sample with a primary electron beam. The secondary electrons are electrons excited from atoms constituting the sample due to inelastic scattering of primary electrons in the sample, and energy thereof is 50 eV or less. Since an emission amount of the secondary electrons is sensitive to a shape of an upper surface of the sample, the detection signal of the first electron detector 6 mainly indicates information on a pattern of a surface (upper surface) of the wafer. On the other hand, the second electron detector detects backscattered electrons generated by irradiating the sample with the primary electron beam. The backscattered electrons (BSEs) are electrons obtained by backscattering the primary electrons emitted to the sample in a scattering process. A reflected electron emission rate of BSE mainly reflects information on a material of a position irradiated with the primary electron beam.

The control unit 16 includes an input unit and a display unit (not illustrated), receives an instruction from a user to the scanning electron microscope, and displays an inspection result. A storage unit 19 stores a processing program executed by the control unit 16. In addition, an image output from the image processing unit 17 is also stored in the storage unit 19.

An operation unit 18 inspects a cross-sectional shape of a pattern by using an image (backscattered electron (BSE) image, secondary electron image) imaged by the SEM, which will be described later in detail.

In the pattern inspecting device of the present embodiment, it is assumed that a learned neural network model is used to estimate a cross-sectional shape of a pattern at a high speed. Since learning of the neural network model requires a high processing capability of a computer, a calculation server 22 connected to the control unit 16 via a network 21 may be provided. The calculation server 22 is not limited to a learning purpose of the neural network model. For example, as will be described later, a plurality of SEMs may be connected to the network 21, and pattern inspections with the plurality of SEMs may be performed by the calculation server 22 instead of the control unit 16. Role sharing between the operation unit 18 and the calculation server 22 may be allocated to be optimal, including network resources.

FIG. 5 is a flowchart of inspecting a cross-sectional shape of a pattern, which is executed by the control unit 16.

S11: The device control unit 20 controls the electron optical system and irradiates the sample 10 with a primary electron beam having a predetermined tilt angle. The image processing unit 17 forms a top-down ESE image of the pattern based on a detection signal from the second electron detector 9. The formed top-down BSE image is stored in the storage unit 19. The operation unit 18 acquires a BSE signal waveform from the acquired top-down. BSE image of the pattern based on a luminance value of a pixel along an X direction of the pattern. The X direction is set in advance as a cross-sectional direction of a pattern that the user wants to observe. The tilt angle of the primary electron beam at this time is, for example, 0° (perpendicular to the upper surface of the sample).

S12: The operation unit 18 generates a difference waveform between the BSE signal waveform acquired in S11 and a reference waveform. The reference waveform is calculated in advance by electron beam simulation and stored in the storage unit 19. The reference waveform varies depending on optical conditions of the primary electron beam and materials of the sample. The optical conditions affecting the reference waveform are an acceleration voltage, a divergence angle, and a tilt angle of the primary electron beam. Therefore, it is desirable to obtain a reference waveform in advance for each combination of these conditions. Instead of acquiring the reference waveform in advance, the reference waveform may be calculated based on an imaging condition every time a BSE image is acquired. In this case, since a large number of computer resources are required to calculate the reference waveform, it is desirable to transmit the imaging condition to the calculation server 22 to obtain the reference waveform.

S13: The presence or absence of a shielded region is determined according to whether a region is present where a slope of the difference waveform, which is obtained in step S12, indicating a relationship between the ESE signal intensity and a difference between an X coordinate of the BSE signal waveform and an X coordinate of the reference waveform which have the same BSE signal intensity is equal to or smaller than the predetermined inclination θth. The region where the slope of the difference waveform is equal to or smaller than the predetermined slope θth is the shielded region.

S14: When the shielded region is not present (No in S13), the cross-sectional shape is estimated based on the acquired BSE signal waveform. In order to estimate the cross-sectional shape at a high speed, the cross-sectional shape is estimated by using a learned neural network model in the present embodiment, which will be described later in detail. The operation unit 18 may store a learned neural network model in the storage unit 19 and call the learned neural network model to estimate the cross-sectional shape, or may transmit the acquired BSE signal waveform to the calculation server 22 and cause the calculation server 22 to estimate the cross-sectional shape by using a learned neural network model. The calculation server 22 and the control unit 16 have the same learned neural network model.

S15: The operation unit 18 displays the cross-sectional shape estimated in step S14 on the display unit.

In contrast, when the shielded region is present (Yes in S13), the cross-sectional shape cannot be obtained based on the BSE signal waveform. Therefore, the tilt angle of the primary electron beam is changed so that the shielded region is irradiated with the primary electron beam.

S21: The imaging condition, under which the shielded region is irradiated with the primary electron beam, is determined. For example, in the example of FIG. 3, the shielded region is not present on the right side-wall by the tilted beam 300, and the shielded region is still present on a left side-wall. In order to eliminate the shielded region on the left-side wall, it is necessary to acquire a top-down BSE image with a primary electron beam having a tilt angle different from that of the tilted beam 300 (hereinafter referred to as a tilt BSE image when it is desired to particularly clearly illustrate an image, acquired with a primary electron beam having a positive or negative tilt angle). Accordingly, in this step, the operation unit 18 determines one or a plurality of imaging conditions (tilt angles) so as to eliminate the shielded region on the side wall of the pattern.

A relative depth position of the shielded region in the cross-sectional shape of the pattern is determined based on the top-down PSE image. Therefore, if a size of an opening of the pattern and an absolute depth of the bottom surface (a distance from the upper surface to the bottom surface of the sample) are known, a tilt angle at which the shielded region is eliminated can be calculated. The size of the opening of the pattern is determined based on a top-down secondary electron image of the pattern formed based on the detection signal from the first electron detector 8. In addition, the absolute depth of the bottom surface can be determined based on a magnitude of a deviation of the bottom surface in top-down BSE images imaged by changing the tilt angle. Instead of calculating a desirable tilt angle individually, the predetermined tilt angle may be determined in advance as a default as the tilt angle in a case where the shielded region is present.

S22: The operation unit 18 confirms whether the tilt angle calculated in step S21 within a range in which the scanning electron microscope is tilted. If the tilt angle is within an allowable range, processing after step S11 is executed based on the imaging condition (tilt angle) determined in step S21.

S23: In step S22, when the tilt angle calculated in step S21 exceeds the allowable range of the scanning electron microscope, the shielded region cannot be eliminated. In this case, the operation unit 18 displays on the display unit that a shielded region that cannot be imaged is present. In this case, the cross-sectional shape cannot be determined.

When a plurality of patterns to be inspected are present on the sample, imaging at the same tilt angle (including 0°) is separated from cross-sectional shape estimation processing based on the BSE image thereafter and are collectively executed, whereby efficiency of the processing can be improved.

In the present embodiment, the estimation of the cross-sectional shape based on the top-down BSE image is performed at a high speed by using the learned neural network. In semiconductor manufacturing process management, it is not always necessary to measure an accurate cross-sectional shape, and if an abnormal cross-sectional shape can be accurately determined based on the top-down BSE image at a high speed, a throughput of the inspection can be improved.

FIG. 6 illustrates a hardware configuration example of the calculation server 22. The calculation server 22 includes a processor 601, a graphics processing unit (GPU) 602, a memory 603, a storage 604, a network interface 605, and an input/output interface 606, which are connected by a bus 607. The input/output interface 606 is connected to an input device such as a keyboard and an operation button (not illustrated) or a display device such as a display to implement a graphical user interface (GUI). The network interface 605 is an interface for connecting to the network 21.

The storage 604 usually includes a non-volatile memory such as a hard disk drive (HDD), a solid state drive (SSD), a read only memory (ROM), and a flash memory, and stores a program executed by the calculation server 22, image data to be processed by the program, and the like. The memory 603 includes a random access memory (RAM), and temporarily stores a program, data necessary for executing the program, and the like according to a command from the processor 601. The processor 601 executes a program loaded from the storage 604 into the memory 603. Although an estimation unit 601a that performs estimation by the neural network model and a learning unit 601b that performs learning of the neural network model are illustrated as functions of the processor in the diagram, the estimation unit 601a and the learning unit 601b are implemented by executing the program stored in the storage 604. Since it is assumed that the calculation server 22 executes the learning of the neural network model, the CPU 602 is mounted in addition to the processor 601 which is a central processing unit (CPU). This is because repetitive operations need to be executed many times in a learning process.

FIG. 7 illustrates an example of the neural network model. A neural network model 703 is a model that outputs probability data $(p_1, p_2 \ldots p_M)$ indicating a probability corresponding to each of M labels (patterns 1 to M having different cross-sectional shapes) in which BSE signal waveform data $(s_1, s_2 \ldots s_N)$ that is input data 701 is predetermined in advance. The patterns 1 to M are defined as patterns having normal or abnormal cross-sectional shapes, and are set by the user. The neural network model 703 includes, for example, a hidden layer 704 having K layers. The input data 701 is input to a hidden layer 704-1 that is a first layer, an output of a hidden layer 704-K that is a final layer is weighted in a fully connected layer 705, and finally the probability data $(p_1, p_2 \ldots p_M)$ is output as output data 702. In this example, in step S14 in the flowchart of FIG. 5 described above, the operation unit 18 (or the calculation server 22) estimates a cross-sectional shape of a labeling pattern having a maximum probability output by the learned neural network model as a cross-sectional shape of the pattern having the acquired BSE signal waveform. The BSE signal waveform data, which is the input data 701, may indicate a relative signal intensity in which the signal intensity on the bottom surface is 0 and the signal intensity on the upper surface of the sample is 1, for example.

The neural network model used in the present embodiment will be described. As described for the reference waveform, the BSE signal waveform is different depending on the optical conditions and the condition of the sample even for the same pattern. The optical conditions affecting the BSE signal waveform are the acceleration voltage, the divergence angle, and the tilt angle of the primary electron beam, and the condition of the sample affecting the PSE signal waveform is the materials of the sample. Therefore, the neural network model learns each combination the three optical conditions and the materials of the sample, and the estimation is performed by using a neural network model in which the conditions are matched. FIG. 8 illustrates an example of a relationship between these parameters and the neural network model. When the number of the acceleration voltages is a ($\alpha 1$ to $\alpha a$), the number of the divergence angles is b ($\beta 1$ to $\beta b$), the number of the tilt angles is c ($\gamma 1$ to $\gamma c$), and the number of the materials of the sample are d ($\delta 1$ to $\delta d$) (each of a, b, c, d is 1 or more), J ($=a \times b \times c \times d$) neural network models corresponding to respective combinations are caused to learn, and the cross-sectional shape is estimated by using a corresponding neural network model. The J neural network models are stored in the storage 604 (storage unit 19). In addition, as long as the BSE signal amount generated when primary electron beams having the same optical conditions are emitted is approximated, the materials that are the conditions of the sample may be regarded as the same material even is the materials are materials having different chemical compositions.

In the learning of the neural network model, learning data is used, and the learning data is a combination of BSE signal waveform data that is an input of the neural network model and a labeling pattern (pattern i (i=1 to M)) having a cross-sectional shape indicated by the BSE signal waveform, is used. As the BSE signal waveform data, a large number of derived cross-sectional shapes approximate to cross-sectional shapes of the pattern i can be generated, and the BSE signal waveform data can be determined by electron beam simulation for these derived cross-sectional shapes to obtain the learning data. Accordingly, the learning of the neural network model can be effectively advanced even in an early stage where an amount of actually measured data is small. On the other hand, since an actually measured top-down BSE image is collected through the pattern inspection of the present embodiment, it is desirable to measure the cross-sectional shape of the pattern from the top-down BSE image and update the neural network model based on the measured cross-sectional shape. FIG. 9A illustrates a flowchart of updating the neural network model. The storage 604 stores a neural network model update program, and the processor 601 executes the update program (the processor 601 that executes the update program corresponds to the learning unit 601b).

S31: The processor 601 acquires the top-down BSE image stored in the storage unit 19 of the control unit 16. At this time, data required for calculating a cross-sectional shape is acquired at the same time. Specifically, the top-down secondary electron image and the absolute depth information for the same pattern are included. Instead of the absolute depth information itself, a top-down BSE image obtained by changing the tilt angle may be used. The top-down BSE image acquired at this time is an image in which the shielded region is determined to be not present (No in step S13).

S32: The processor 601 calculates a cross-sectional shape in a predetermined direction based on the top-down BSE image. For the calculation of the cross-sectional shape, for example, a pattern measurement method disclosed in PTL 1 may be used.

S33: The processor 601 determines whether the cross-sectional shape calculated in step S32 corresponds to any one of existing labeling patterns. As illustrated in FIG. 9B, the labeling pattern i (i=1 to M) is positioned in an m-dimensional feature data space, and it is determined that a pattern included in a region within a predetermined distance around a typical pattern corresponds to the labeling pattern. For example, it is determined that, in the feature data space, a pattern included in a region (910, 920 referred to as an approximate region) within a predetermined distance from the pattern i (901, 902) corresponds to the pattern i. When a certain pattern is approximate to the pattern i, it means that the pattern is included in the approximate region of the pattern i.

That is, when feature data is calculated for the cross-sectional shape and a position in the feature data space of the calculated cross-sectional shape is included in the approximate region of the pattern i, it is determined that the pattern having the cross-sectional shape corresponds to the pattern i, and when the position is not included in any of the approximate regions, it is determined that the pattern having the cross-sectional shape does not correspond to any of the existing labeling patterns.

S34: When is determined that the calculated cross sectional shape corresponds to the pattern i, the processor 601 sets a combination of the BSE signal waveform data and the pattern i (label) as new learning data.

On the other hand, when it is determined that the calculated cross-sectional shape does not correspond to any of the listing labeling patterns, the calculated cross-sectional shape may not be used as the learning data, or a new labeling pattern may be newly defined. Here, a case where the new labeling pattern is defined will be described.

S41: A new labeling pattern (M+1) 903 is defined based on the calculated cross-sectional shape. A cross-sectional shape of the pattern (M+1) may be the calculated cross-sectional shape itself or may be set based on a cross-sectional shape calculated by the user.

S42: The processor 601 generates a large number of derived cross-sectional shapes approximate to the cross-sectional shape of the pattern (M+1). The derived cross-sectional shapes refer to a cross-sectional shape of a pattern 904 included in an approximate region 930 of the pattern (M+1) illustrated in FIG. 9B. In order to perform the learning by using the derived cross-sectional shapes, it is necessary to generate as many derived cross-sectional shapes as required for the learning.

S43: The processor 601 performs electron beam simulation for each of the derived cross-sectional shapes to determine ESE signal waveform data.

S44: A combination of the BSE signal waveform data determined in step S43 and the pattern (M+1) (label) is set as new learning data. The number of pieces of the new learning data is the number of the derived cross-sectional shapes generated in step S42.

S35: The processor 601 executes training of the neural network model by using the new learning data generated in step S34 or step S44.

S36: The processor 601 stores the neural network model updated in step S35 is the storage 604.

Here, by defining a condition for defining the new labeling pattern in advance (for example, when a certain number of cross-sectional shapes that are not included in the existing labeling patterns is generated in a relatively close position of the feature data space, or the like), extended learning can be automatically performed.

The neural network model used in the present embodiment is not limited to the above model. FIG. 10A illustrates an example of another neural network model. A neural network model 1003 includes a hidden layer 1004 having K layers, and a fully connected layer 1005. The neural network model 1003 has the same configuration as the model illustrated in FIG. 7, but differs in output data to be estimated. The neural network model 1003 is a model that outputs relative depth data ($h_1, h_2, \ldots h_N$) at the same X coordinate as output data 1002 with respect to BSE signal waveform data ($s_1, s_2, \ldots s_N$) (here, the BSE signal waveform data is a relative value), which is input data 1001. A relative depth at each X coordinate indicates a depth of a cross section of the pattern at a position with respect to a depth of the bottom surface of the pattern. In this case, in step S14 in the flowchart of FIG. 5, the operation unit 18 (or the calculation server 22) can estimate an accurate cross-sectional shape by multiplying the relative depth of the pattern in the X direction output by the neural network model by an absolute depth of the bottom surface separately determined.

Also, in the case of the neural network model of FIG. 10A, the J (=a×b×c×d) neural network models corresponding to the respective combinations illustrated in FIG. 8 are caused to learn, and a cross-sectional shape is estimated by using a corresponding neural network model.

Also, for the neural network model in FIG. 10A, it is desirable to update the neural network model based on the actually measured top-down BSE image acquired through the pattern inspection of the present embodiment. This flow is illustrated in FIG. 10B.

S51: A cross-sectional shape is estimated by using the neural network model. This processing corresponds to the processing of step S14 in the flowchart of FIG. 5.

S52: The processor 601 compares the estimated cross-sectional shape with a cross-sectional shape in existing learning data. Specifically, feature data is calculated for each cross-sectional shape, and a degree of similarity is determined based on a distance in the m-dimensional feature data space illustrated in FIG. 9B.

When the estimated cross-sectional shape has a large difference from the cross-sectional shape in the existing learning data, estimation accuracy may decrease. Therefore, for a pattern having a large difference from the learned cross-sectional shape, it is desirable to generate learning data including a pattern approximate to the pattern again and update the neural network model. Therefore, a reference value of the distance in the m-dimensional feature data space is determined in advance, and whether a shortest distance from the existing learning data exceeds the reference value is determined (step S53). When the shortest distance exceeds the reference value (Yes in step S53), the processing proceeds to step S61, and when the shortest distance is equal to or smaller than the reference value (No in step S53), the processing proceeds to step S54.

S61: This processing corresponds to the processing of steps S31 to S32 in the flowchart of FIG. 9A.

S62: The processor 601 generates a large number of derived cross-sectional shapes approximate to the cross-sectional shape of the pattern calculated in step S61. The derived cross-sectional shape is the cross-sectional shape of the pattern included in the approximate region of the pattern illustrated in FIG. 9B. In order to perform the learning by using the derived cross-sectional shapes, it is necessary to generate as many derived cross-sectional shapes as required for the learning.

S63: This process corresponds to the processing of step S43 in the flowchart of FIG. 9A.

S64: The processor 601 sets, as new learning data, a combination of the BSE signal waveform data obtained in step 363 and relative depth data of the derived cross-sectional shapes generated in step S62. The number of pieces of the new learning data is the number of the derived cross-sectional shapes generated in step S62.

On the other hand, when the estimated cross-sectional shape is sufficiently similar to the cross-sectional shape in the existing learning data (No in step S53), a combination of actually measured BSE signal waveform data and relative depth data of a corresponding cross-sectional shape is set as new learning data.

S54: This processing corresponds to the processing of steps S31 to S32 in the flowchart of FIG. 9A. However, in this case, it is considered that the estimation accuracy of the cross-sectional shape using the neural network model is sufficiently high, so that the processing of step S54 may be omitted, and the estimated cross-sectional shape may be used as it is in step S55.

S55: The processor 601 sets, as new learning data, a combination of the actually measured BSE signal waveform data and the relative depth data of the cross-sectional shape estimated by the neural network model or relative depth data of the cross-sectional shape calculated in step S54.

S56 to S57: This processing corresponds to the processing of steps S35 to S36 of the flowchart of FIG. 9A.

As illustrated in FIG. 11, the plurality of SEMs may be connected to the calculation server 22. For exam pie, when SEMs 1101 to 1103 are used for inspection of a cross-sectional shape of a pattern in the same semiconductor manufacturing process, the calculation server 22 may be provided in common to the SEMs 1101 to 1103. The calculation server 22 trains and updates a neural network model 1110 based on top-down BSE images acquired by the SEMs 1101 to 1103, and stores the updated neural network model 1110 in the storage units 19 of the SEMs 1101 to 1103. In each SEM, the cross-sectional shape of the pattern is inspected by using the learned neural network model 1110 stored in the storage unit 19.

FIG. 12 illustrates a display example of the inspection result of the cross-sectional shape. Rectangles 1202 that divide an inspection region are displayed in a circle 1201 indicating a wafer to be inspected. In this example, regarding a rectangular region in which a pattern having a cross section with a bowing shape is found, the rectangular region is displayed in an identifiable manner with a color or a pattern. In this case, whether the bowing shape is present can be determined by the presence or absence of the shielded region on the side wall of the pattern, so that steps S14 to S15 in the flow of FIG. 5 may be omitted as long as only the bowing shape is determined. The twisting shape can also be determined based on the presence or absence of the shielded region.

FIG. 13 illustrates another display example of the inspection result of the cross-sectional shape. On a display, screen 1300, rectangles 1302 that divide the inspection region are displayed in a circle 1301 indicating a wafer to be inspected. In this example, the rectangles are displayed in an identifiable manner with a color and a pattern being changed for each found cross-sectional shape. The colors and patterns displayed in the rectangles 1302 in a legend field 1303 indicate the cross-sectional shapes of the pattern. Division in the legend corresponds to the labeling pattern illustrated in FIG. 7B; the estimation using the neural network model, the colors and the patterns displayed in the rectangles 1302 are determined according to which labeling pattern is determined to correspond. Alternatively, when the neural network model illustrated in FIG. 10A is used, an estimation result classified according to a reference of the legend.

The embodiment of the invention has been described above with reference to the drawings. However, the invention should not be construed as being limited to the description of the embodiment described above. The specific configuration can be changed without departing from the spirit and scope of the invention.

Positions, sizes, shapes, ranges, and the like of the respective components illustrated in the drawings may not represent actual positions, sizes, shapes, ranges, and the like in order to facilitate understanding of the invention. Therefore, the invention is not limited to the positions, the sizes, the shapes, and the ranges disclosed in the drawings.

In the embodiment, control lines and information lines are considered to be necessary for description, and all control lines and information lines are not necessarily shown in the product. For example, all configurations may be connected to each other.

The invention is not limited to the described embodiment and includes various modifications. The configurations of the described embodiment have been described in detail for easy understanding of the invention, and the invention is not necessarily limited to those including all the configurations described above. A part of the configurations of each embodiment can be deleted or replaced with another configuration in a range in which contradiction does not occur.

A part or all of the above configurations, functions, processing units, and the like may be implemented by hardware by, for example, designing with an integrated circuit. Further, the invention can also be implemented by program codes of software that implement the functions of the embodiment. In this case, a storage medium recording the program codes is provided to a computer, and a processor of the computer reads out the program codes stored in the storage medium. In this case, the program codes read out from the storage medium implement the functions of the above embodiment.

REFERENCE SIGNS LIST

1 electron optical column
2 sample chamber
3 electron gun
3a ideal optical axis
4 condenser lens
5, 6 deflector
7 objective lens
8, 9 electron detector
10 wafer
11 XY stage
12, 13 amplifier
14 electron optical system control unit
15 stage control unit
16 control unit
17 image processing unit
18 operation unit
19 storage unit
20 device control unit
21 network
22 calculation server
100 vertical irradiation beam
101, 201 cross-sectional shape
102 reference cross-sectional shape
111, 211, 311 BSE signal waveform
112, 312 reference waveform
203 shielded region
300 tilted beam
601 processor
602 GPU
603 memory
604 storage
605 network interface
606 input/output interface
607 bus
701, 1001 input data
702, 1002 output data
703, 1003, 1110 neural network model
704, 1004 hidden layer
705, 1005 fully connected layer

The invention claimed is:

1. A pattern inspecting device for inspecting a cross-sectional shape of a pattern formed on a sample, the pattern inspecting device comprising:
    an electron optical system configured to irradiate the sample with a primary electron beam under control of a device control unit;
    an electron detector configured to detect backscattered electrons emitted by scanning the pattern with the primary electron beam;
    an image processing unit configured to form an image based on a detection signal of the electron detector; and
    an operation unit configured to generate, based on a reference waveform and a BSE signal waveform that is extracted from a BSE image formed by the image processing unit based on the detection signal of the electron detector and indicates a backscattered electron signal intensity from the pattern along a first direction, a difference waveform indicating a relationship between the backscattered electron signal intensity and a difference between a coordinate of the BSE signal waveform and a coordinate of the reference waveform which have the same backscattered electron signal intensity, and determine presence or absence of a shielded region that is not irradiated with the primary electron beam on a side wall of the pattern based on the difference waveform, wherein the reference waveform indicates a backscattered electron signal intensity from a reference pattern in which a side wall is formed perpendicularly to an upper surface and a bottom surface of the pattern along the first direction when the reference pattern is scanned with the primary electron beam.

2. The pattern inspecting device according to claim 1, further comprising:

a storage unit configured to store a plurality of the reference waveforms, wherein the operation unit selects, among the plurality of reference waveforms, reference waveform, in which an optical condition of the primary electron beam and condition of the sample are matched, as a reference waveform for generating the difference waveform.

3. The pattern inspecting device according to claim 2, wherein the optical condition of the primary electron beam includes an acceleration voltage, a divergence angle, and a tilt angle of the primary electron beam, and the condition of the sample includes a material of the sample.

4. The pattern inspecting device according to claim 1, wherein the operation unit determines that the shielded region is present on the side wall of the pattern when a slope of the reference waveform is equal to or smaller than a predetermined slope.

5. The pattern inspecting device according to claim 1, wherein the operation unit determines a tilt angle for irradiating each shielded region with the primary electron beam when it is determined that the shielded region is present on the side wall of the pattern, and the device control unit controls the electron optical system to irradiate the sample with a primary electron beam having the determined tilt angle.

6. The pattern inspecting device according to claim 1, wherein the operation unit inputs the BSE signal waveform, by which it is determined that the shielded region is not present on the side wall of the pattern, to a learned neural network model, and estimates a cross-sectional shape of the pattern.

7. The pattern inspecting device according to claim 6, further comprising:

a storage unit configured to store a plurality of the learned neural network models, wherein the operation unit selects, among the plurality of learned neural network models, a learned neural network model, is which an optical condition of the primary electron beam and a condition of the sample are matched, as a learned neural network model for estimating the cross-sectional shape of the pattern.

8. The pattern inspecting device according to claim 7, wherein the optical condition of the primary electron beam includes an acceleration voltage, a divergence angle, and a tilt angle of the primary electron beam, and the condition of the sample includes a material of the sample.

9. A pattern inspecting device for inspecting a cross-sectional shape of a pattern formed on a sample, the pattern inspecting device comprising:

a storage configured to store a plurality of learned neural network models; and an estimation unit configured to estimate the cross-sectional shape of the pattern by using any one of the plurality of learned neural network models stored is the storage, wherein the learned neural network model sets, as input data, BSC signal waveform data that is extracted from a top-down backscattered electron image of the pattern acquired by using a charged particle beam device and indicates a backscattered electron signal intensity from the pattern along a first direction, and the estimation unit selects, among the plurality of learned neural network models, a learned neural network model, in which an optical condition of the primary electron beam and a condition of the sample when the charged particle beam device acquires the top-down backscattered electron image are matched, as a learned neural network model for estimating the cross-sectional shape of the pattern.

10. The pattern inspecting device according to claim 9, wherein the optical condition of the primary electron beam includes an acceleration voltage, a divergence angle, and a tilt angle of the primary electron beam, and the condition of the sample includes a material of the sample.

11. The pattern inspecting device according to claim 9, further comprising:

a learning unit configured to train the learned neural network model by using new learning data and update the learned neural network model, wherein the learned neural network model sets, as output data, a probability corresponding to a plurality of predetermined labeling patterns the input data of which is determined in advance, and the learning unit sets a combination of the BSE signal waveform data and a labeling pattern approximate to the BSE signal waveform data as the new learning data when a cross-sectional shape of the pattern measured based on the top-down backscattered electron image is approximate to a cross-sectional shape of any one of the plurality of labeling patterns.

12. The pattern inspecting device according to claim 11, wherein, when a new labeling pattern is defined when the cross-sectional shape of the pattern measured based on the top-down backscattered electron image is not approximate to any one of the cross-sectional shapes of the plurality of labeling patterns, the learning unit generates a plurality of derived cross-sectional shapes approximate to a cross-sectional shape of the new labeling pattern, generates BSE signal waveform data indicating a backscattered electron signal intensity from a pattern having the derived cross sectional shape along the first direction by electron beam simulation for each of the plurality of derived cross-sectional shapes, and sets a combination of the BSE signal waveform data for the derived cross-sectional shape and the new labeling pattern as the new learning data.

13. The pattern inspecting device according to claim 9, further comprising:
a learning unit configured to train the learned neural network model by using new learning data and update the learned neural network model, wherein
the learned neural network model sets relative depth data indicating a depth of a cross section of the pattern along the first direction relative to a depth of a bottom surface of the pattern as output data, and
the learning unit sets a combination of the BSE signal waveform data and relative depth data of the cross-sectional shape of the pattern estimated by the estimation unit or relative depth data of the cross-sectional shape of the pattern measured based on the top-down backscattered electron image as the new learning data when a difference between the cross-sectional shape of the pattern estimated by the estimation unit and a cross-sectional shape in existing learning data is equal to or smaller than a predetermined reference value.

14. The pattern inspecting device according to claim 13, wherein,
when the difference between the cross-sectional shape of the pattern estimated by the estimation unit and the cross-sectional shape in the existing learning data exceeds the predetermined reference value, the learning unit generates a plurality of derived cross-sectional shapes approximate to the cross-sectional shape of the pattern measured based on the top-down backscattered electron image, generates BSE signal waveform data indicating a backward scattered electron signal intensity from a pattern having the derived cross-sectional shape along the first direction by electron beam simulation for each of the plurality of derived cross-sectional shapes, and sets a combination of the BSE signal waveform data for the derived cross-sectional shape and relative depth data of the derived cross-sectional shape as the new learning data.

15. A pattern inspecting device for inspecting a cross-sectional shape of a pattern formed on a sample, the pattern inspecting device comprising:
a storage configured to store a plurality of learned neural network models; and
a learning unit configured to train the learned neural network model by using new learning data and update the learned neural network model, wherein
the learned neural network model sets, as input data, BSE signal waveform data that is extracted from a top-down backscattered electron image of the pattern acquired by using a charged particle beam device and indicates a backscattered electron signal intensity from the pattern along a first direction, and
the learning unit selects, among the plurality of learned neural network models stored in the storage, a learned neural network model, is which an optical condition of a primary electron beam and a condition of the sample when the top-down backscattered electron image is acquired are matched, as a learned neural network model to be updated.

16. The pattern inspecting device according to claim 15, wherein
the optical condition of the primary electron beam includes as acceleration voltage, a divergence angle, and a tilt angle of the primary electron beam, and the condition of the sample includes a material of the sample.

* * * * *